(12) United States Patent (10) Patent No.: US 6,507,801 B1
Oh et al. (45) Date of Patent: Jan. 14, 2003

(54) SEMICONDUCTOR DEVICE TESTING SYSTEM

(75) Inventors: Se-Jang Oh, Anyang (KR); Ki-Sang Kang, Suwon (KR); Jeong-Ho Bang, Chonan (KR)

(73) Assignee: Samsung Electronics Co., Ltd., Hwasung (KR)

( * ) Notice: Subject to any disclaimer, the term of this patent is extended or adjusted under 35 U.S.C. 154(b) by 77 days.

(21) Appl. No.: 09/697,026

(22) Filed: Oct. 25, 2000

(30) Foreign Application Priority Data

Oct. 25, 1999 (KR) .............................. 99-46322

(51) Int. Cl.[7] ................................. G06F 3/00
(52) U.S. Cl. .................. 702/120; 702/81; 702/117; 702/118; 702/123
(58) Field of Search ................... 702/118, 120, 702/123, 81, 117; 324/753, 142, 158; 714/724

(56) References Cited

U.S. PATENT DOCUMENTS 5,384,784 A * 1/1995 Mori et al. ................ 371/21.1
5,428,754 A * 6/1995 Baldwin ..................... 395/375
6,157,200 A * 12/2000 Okayasu .................... 324/753

* cited by examiner

*Primary Examiner*—Marc S. Hoff
*Assistant Examiner*—Felix Suarez
(74) *Attorney, Agent, or Firm*—Marger Johnson & McCollom P.C.

(57) ABSTRACT

The present invention relates to a semiconductor device testing system having an advanced testing capability for performing tests on a semiconductor device. A system frame includes both normal and high-speed testing formatters, and a test head is arranged in electrical communication with the system frame. Normal PIN drivers are included to operate the testing system at a first frequency to transmit the signals required to perform tests at a normal speed. High-speed PIN drivers are also included to operate the testing system at a second frequency, higher than the first frequency, to transmit the signals required to perform tests at a higher speed. In this manner, the testing system of this invention is able-to achieve superior testing performance while reducing the overall system production cost.

20 Claims, 9 Drawing Sheets

SEMICONDUCTOR DEVICE TESTING SYSTEM

BACKGROUND OF THE INVENTION

1. Field of the Invention

The present invention relates to a semiconductor device testing system for testing a semiconductor device, such as a semiconductor memory, and more particularly to a semiconductor device testing system for performing AC tests on the semiconductor device to evaluate operational functions of the device.

2. Description of the Prior Art

An electrical die sorting (EDS) process is one of the steps in fabricating a semiconductor device, such as a memory device, a non-memory device, or other similar devices. In general, semiconductor device testing systems are used during the EDS process to determine the electrical properties of a wafer-level semiconductor device. More specifically, during the EDS process, a semiconductor device testing system is used to conduct a series of wafer-level tests to evaluate the electrical properties and functions of the semiconductor device.

The EDS process itself is divided into two primary stages, a pre-laser stage and a laser repair stage. In the pre-laser stage, defective chips on the semiconductor wafer are screened to determine which of those chips can possibly be repaired. The addresses of the defective chips that can possibly be repaired are transmitted to the laser repair stage so that laser repair of those chips can be attempted. During the pre-laser stage, a prober is used to load and align the chips with testing pointers. Wafers are loaded into the prober to undergo a series of tests. DC tests are performed to evaluate the DC properties of the device, such as current and voltage levels. AC tests are also performed to determine operational functions of the device.

Both the AC and the DC tests are performed by a semiconductor device testing system during the EDS process. To perform the DC tests, the semiconductor device testing system generates a variety of electrical signals that are transmitted through PIN drivers to each pad of the semiconductor device. The semiconductor device testing system decodes the data obtained by these tests and determines whether the current, voltage, and other DC parameters are within acceptable performance levels.

The AC tests, on the other hand, are performed to analyze operational functions of the device, such as circuit operations, data storage, etc., under predetermined supply voltage margin, input voltage margin, timing margin, temperature, and humidity conditions. The AC tests for a DRAM device include, for instance, a refresh test, a functional test, a speed test, and a margin test. To perform the AC tests, wafer pads are loaded into the top portion of a chuck stage of the prober by vacuum absorption and are then placed onto a test board (or probing card) that has a plurality of testing pointers. A test head of the semiconductor device testing system contacts the test board to perform the wafer-level testing processes in accordance with a preset testing program.

As semiconductor circuits become more complicated, the number of CMOS transistors integrated onto each silicon chip increases proportionally. Accordingly, it is desirable to perform high-speed, highly precise, testing procedures during the EDS process, in addition to the normal testing procedures. Unfortunately, in conventional semiconductor device testing systems, there are only certain uniformly specified PIN drivers available to output the required testing signals. And because the testing capability of the semiconductor device testing system is directly related to the basic specifications of the PIN drivers, it is very difficult for conventional systems to operate above their basically specified functions. A conventional semiconductor device testing system that is configured to operate at a normal operational speed, therefore, cannot be used to perform tests at a higher operational speed. Conventionally, a separate, high-speed testing unit is consequently required to perform the high-speed tests on semiconductor devices.

According to the prior art, therefore, after a high-speed semiconductor memory device is tested at a first, normal operational speed using a normal-speed semiconductor device testing system, a separate high-speed testing unit must be used to perform tests at a second, higher operational speed. Unfortunately, the need for separate testing units results in the added expense of additional equipment. Also, because the normal and high-speed tests are performed sequentially, the need for separate testing equipment significantly increases the amount of time required to perform those tests.

It is therefore imperative to the industry that a semiconductor device testing system be developed that simplifies the process for testing a high-speed semiconductor device and reduces the time and expense of the overall testing process.

SUMMARY OF THE INVENTION

An object of the present invention is to enable a semiconductor device testing system that provides both normal and high-speed testing capabilities in a single testing unit.

Another object of the present invention is to enable a semiconductor device testing system that can perform normal and high-speed AC tests on a semiconductor memory device while decreasing the time and expense of the overall testing process.

A third object of the present invention is to provide a semiconductor device testing system and method, wherein high-speed PIN drivers are partly embedded in a conventional normal testing system to enable the performance of both high-speed and normal-speed testing operations by a single testing unit.

In order to accomplish the aforementioned objects, a semiconductor device testing system is configured to perform multiple tests on a semiconductor device during an EDS process. The semiconductor device testing system includes a system frame that includes both normal and high-speed testing formatters. A test head, that includes both normal PIN drivers and high-speed PIN drivers, is connected to the system frame. The normal PIN drivers are configured to operate at a first frequency to transmit signals required for normal-speed tests to a semiconductor device. The high-speed PIN drivers are configured to operate at a second frequency, higher than the first frequency, to transmit the signals required for high-speed tests to the semiconductor device. Normal and high-speed testing capabilities are thereby integrated into a single testing unit.

The integration of normal-speed and high-speed testing capabilities into a single testing unit improves the testing capability of the system while only minimally increasing the production cost of the system above the cost of the normal testing system alone. Furthermore, this integration allows the overall production costs for the normal and high-speed testing system to be reduced.

In accordance with the present invention, a method is also provided that allows a semiconductor device testing system to perform a first test at a normal speed, and a second test at a higher speed. The method includes using high-speed PIN drivers and normal PIN drivers as main PIN drivers on the test head of the semiconductor device testing system. Preformatted signals for performing high-speed operations are sent to the high-speed PIN drivers to perform the second test.

BRIEF DESCRIPTION OF THE DRAWINGS

The foregoing objects and advantages of the invention will become more apparent from the following detailed description of a preferred embodiment, which proceeds with reference to the accompanying drawings in which.

DETAILED DESCRIPTION OF THE PRESENT INVENTION

Figure 1:
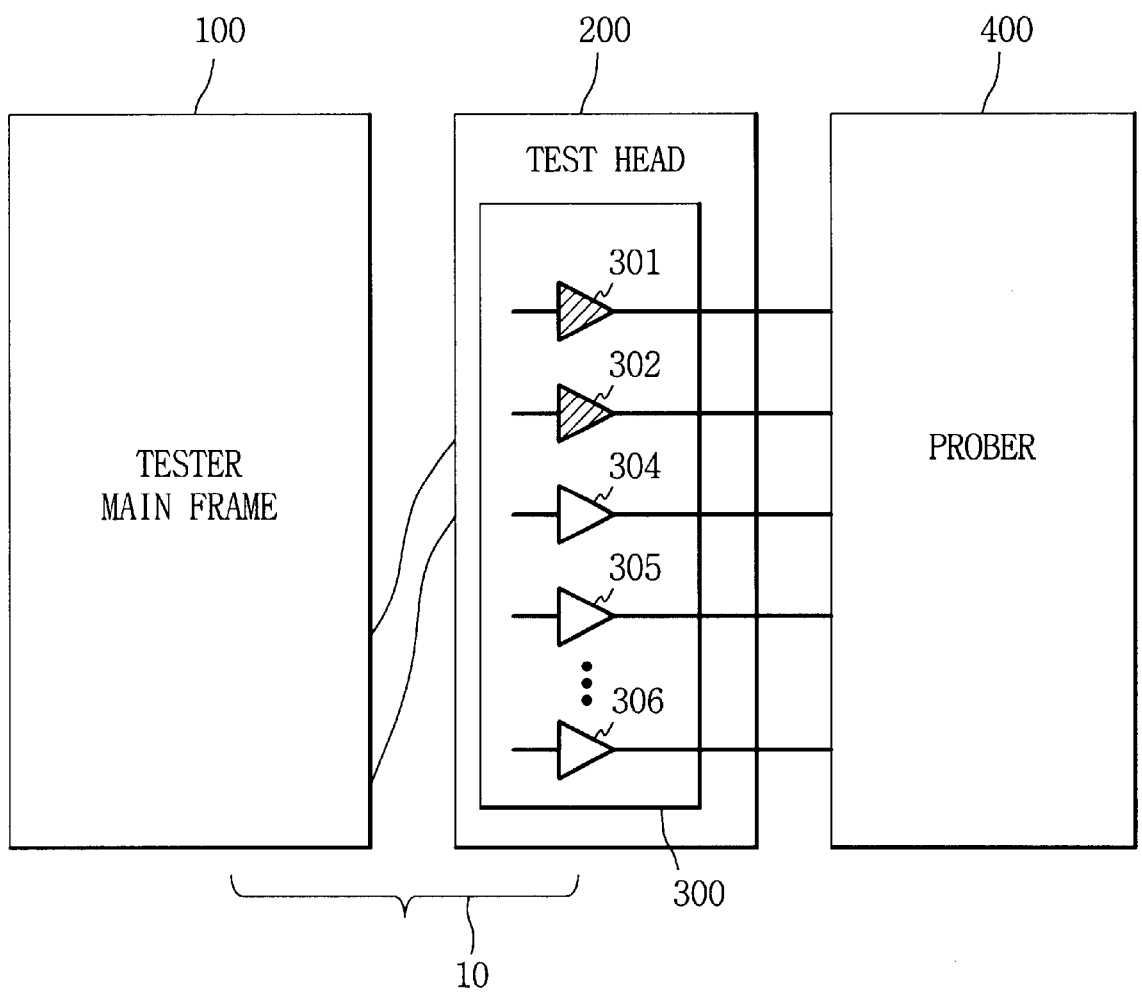
FIG. 1 is a schematic block diagram illustrating a semiconductor device testing system having both normal and high-speed PIN drivers in accordance with a preferred embodiment of the present invention.

The following detailed description of a preferred embodiment proceeds with reference to the accompanying drawings, in which the same or similar parts are indicated by the same reference numerals for convenience in description and to facilitate a more complete understanding of the invention.

FIG. 1 is a schematic block diagram illustrating a semiconductor device testing system 10 in accordance with a preferred embodiment of the present invention. As shown in FIG. 1, the semiconductor device testing system 10 includes a system frame 100 and a test head 200. The test head 200 includes a PIN driver assembly 300 having normal PIN drivers 304, 305, 306 and high-speed PIN drivers 301, 302. All of the PIN drivers 301, 302, 304–306 of the PIN driver assembly 300 are connected to a prober 400 to transmit the signals required for the device tests. The high-speed PIN drivers 301, 302, for high-speed testing operations, and normal-speed PfN drivers 304–306, for normal-speed testing operations, are incorporated into a single testing unit 10. As a result, the present invention allows a single testing unit to test a semiconductor device at both a normal speed and a high speed, while minimizing the production cost of the overall testing system.

As an illustration, if a semiconductor memory chip is designed to operate at an operational speed of 120 MHz, a variety of AC tests need to be performed on the chip at 30 MHz (i.e., normal speed), while other tests need to be performed at 120 MHz (i.e., high speed). By integrating both normal and high-speed PIN drivers within the test head 200, the testing system 10 of the present invention can be used to perform both of these margin tests.

The integration of high-speed PIN drivers 301, 302 along with the normal PIN drivers 304, 305, 306 in the test head 200, makes it possible for the same testing unit 10 to perform tests at operational speeds higher than normal operational speeds, as well as at the normal speeds specified for the basic testing conditions. In order to perform the high-speed testing processes, however, the testing system 10 needs to produce a high-speed testing signal by outputting pulses to the high-speed PIN drivers 301, 302 using as many clock edges as needed. For instance, when the testing system 10 is required to perform high-speed tests at 125 MHz, on a device whose normal operational frequency is 31.25 MHz (a cycle of 32 nS), eight clock edges are provided during each output signal segment to operate the high-speed PIN drivers 301, 302 at the required speed.

Figure 2:
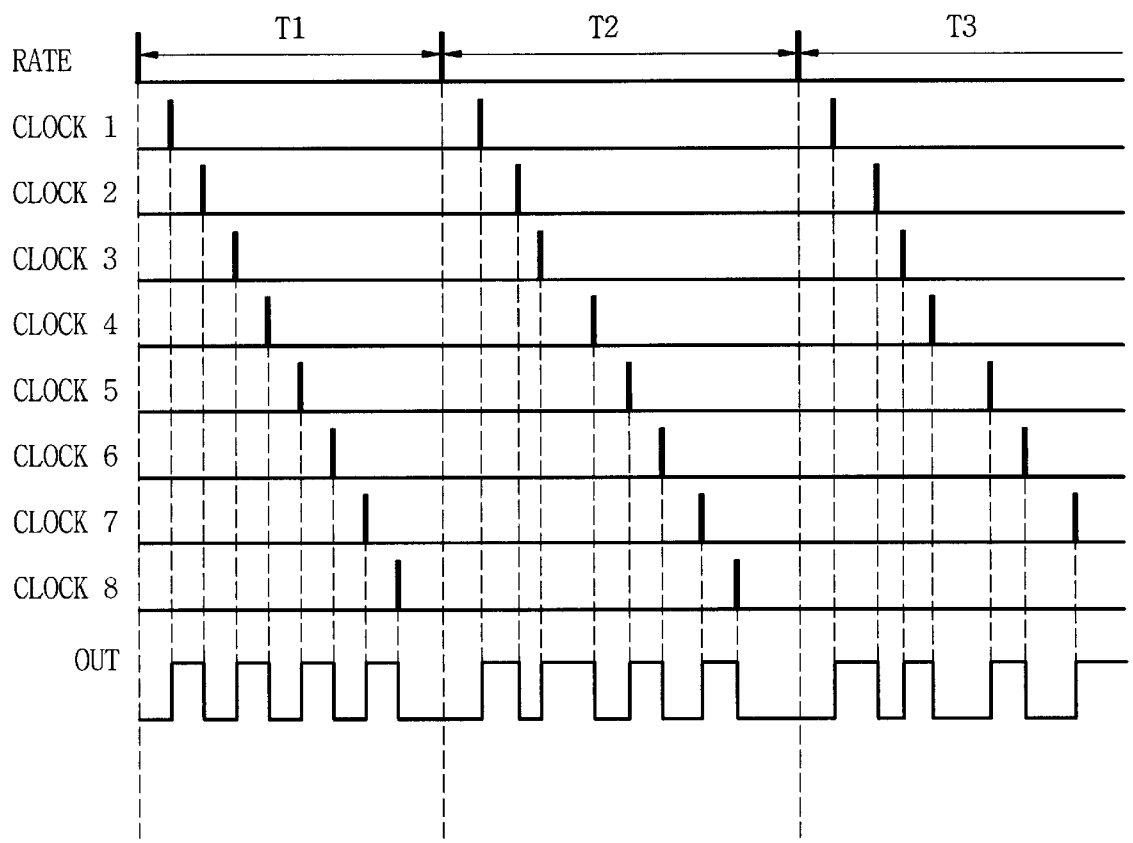
FIG. 2 is a timing diagram illustrating various waveforms that can be output from high-speed PIN drivers of the testing system of FIG. 1 using clocks assigned to the high-speed PIN drivers.

FIG. 2 is a timing diagram illustrating the output waveforms OUT from the high-speed PIN drivers 301, 302 of the testing system 10 of FIG. 1, according to the clock values CLOCK1–8 supplied thereto. It should be noted that any change in the preset values of the clocks CLOCK1–8 in intervals T1, T2, T3, also changes the waveforms output during those intervals T1, T2, T3.

Figure 3:
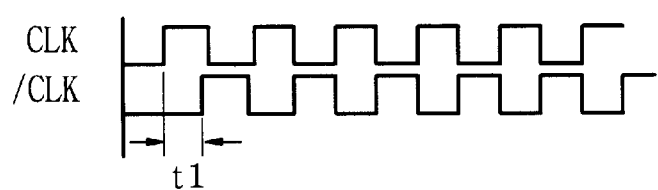
FIG. 3 is a timing diagram illustrating a clock signal and a delayed clock signal used to create the input into the high-speed PIN drivers of the testing system of FIG. 1.

FIG. 3 is a timing diagram illustrating clock waveforms used to generate the input to the high-speed PIN drivers 301, 302 of the testing system 10 shown in FIG. 1. In order to minimize the number of clocks required, the clock and delayed clock signals CLK, /CLK, respectively, as shown in FIG. 3, can be generated using the circuit depicted by the schematic block diagram of FIG. 4. Specifically, FIG. 4 is a schematic block diagram illustrating a circuit configured to generate the clock signals shown in FIG. 3 using only a single input clock 30.

Figure 4:
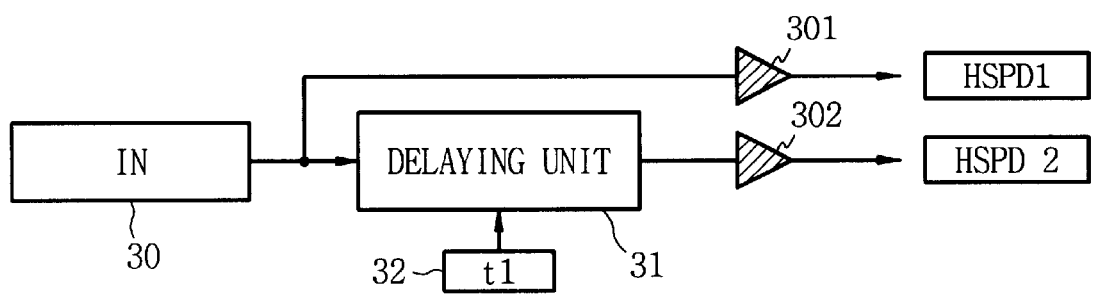
FIG. 4 is a schematic circuit diagram illustrating a clock generation circuit capable of generating the clock and the delayed clock signals of FIG. 3 using a single input clock.

Referring to FIGS. 3 and 4, the clock generation circuit includes a source clock input unit 30 that provides a clock signal CLK as a source clock. A clock delaying unit 31 receives the source clock signal CLK from the input unit 30 and outputs a delayed output clock signal /CLK. The delaying unit 31 delays output of the delayed clock signal /CLK in response to a time delaying signal T1. A delay controlling unit 32 supplies the time delaying signal T1; to the clock delaying unit 31. This circuit minimizes the number of clocks needed to operate the high-speed PIN drivers 301, 302. The length of the delay t1 between the source clock signal CLK and the delayed clock signal /CLK is determined by the time delaying signal T1.

Figure 5:
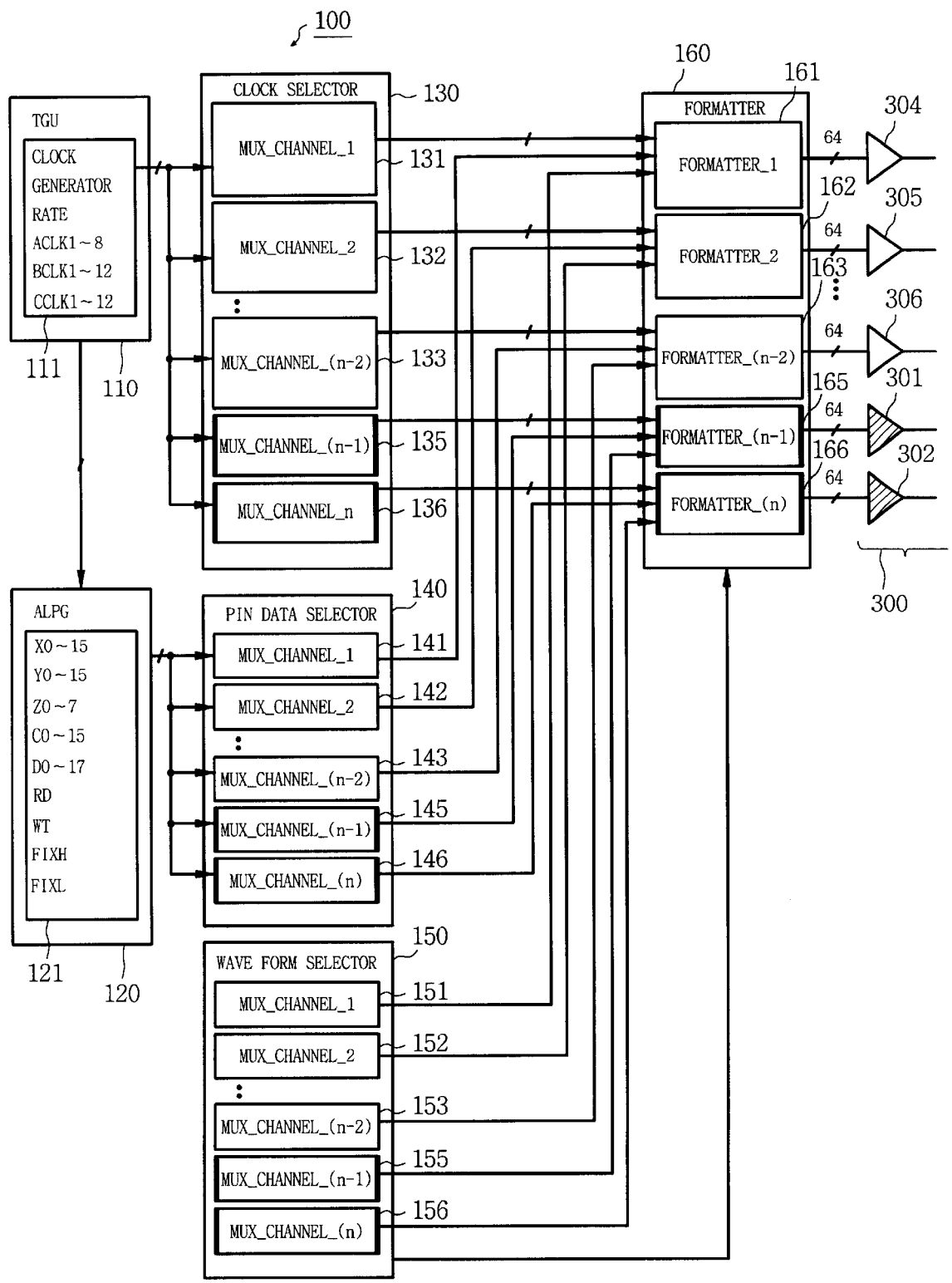
FIG. 5 is a block diagram illustrating the components of the testing system of FIG. 1.

FIG. 5 is a schematic block diagram illustrating a preferred embodiment of a system frame 100 of the testing system, 10 of FIG. 1. It should be noted that while the structure of the system frame 100 described here is the preferred embodiment for a 64-bit parallel testing system, it is but one of many potential embodiments, to which any number of modifications can be made, as desired, to adapt the invention for use in other testing devices.

Referring to FIG. 5, the system frame 100 includes a timing generating unit 110, having a clock generator 111. An algorithmic pattern generating unit 120 is also included, having a pattern generator 121. A clock selector 130, a PIN data selector 140, a waveform selector 150, and a formatting unit 160 are also included as part of the system frame 100.

The timing unit 110, using the clock generator 111, generates the timing for the system signals. Specifically, the clock generator 111 generates a variety of clock signals ACLK1~8, BCLK1~12, CCLK1~12 and a rate signal RATE. In the preferred embodiment shown here, the clock generator 11 has thirty-two output lines for outputting these signals. In order to define the type of signals within each operational cycle, the pattern generator 121 of the algorithmic pattern generating unit 120 receives signals from the timing generating unit 110 and, in turn, generates X, Y, and Z addresses X0~15, Y0~15, Z0~7, control commands C0~15, data signals D0~7, read and write mode values RD, WT, and high and low fixing level values FIXH, FIXL, respectively.

The clock selector 130 also receives signals from the clock generator 111. The clock selector 130 selects signals for its multiplexer output channels from the supplied clock signals ACLK1~18, BCLK1~12, CCLK1~12 and the rate signal RATE. The clock selector 130 outputs the selected signals to the formatting unit 160. More specifically, the clock selector 130 includes normal multiplexers 131–133, each having a multiplexer output channel MUX_CHANNEL_1-(n-2), respectively, and high-speed multiplexers 135, 136, each having a multiplexer output channel MUX_CHANNEL_(n-1), n, respectively.

A first one of the normal multiplexers 131 is constructed having eight inputs and one output to select one of the eight ACLK1~8 clock signals for its channel output MUX_CHANNEL_1. A second one of the normal multiplexers 133 has twelve inputs and one output to select one of the twelve BCLK1~12 clock signals for its channel output MUX_CHANNEL_2. Similarly, a third one of the normal multiplexers 133 includes twelve inputs and one output to select one of the twelve CCLK1~12 clock signals for its channel output MUX_CHANNEL_(n-2). Unlike the normal multiplexers 131–133, the high-speed multiplexers 135, 136, are each constructed with only three inputs and one output to selectively output one of the three BCLKa–d clocks, and one of the three CCLKa–d clocks, respectively.

The PIN data selector 140 receives its inputs, including the X, Y, Z addresses X0~15, Y0~15, Z0~7, control commands C0~15, data inputs D0~17, mode values RD, WT, and fixed level values FIXH, FIXL, from the algorithmic pattern generating unit 120. The PIN data selector uses these input signals to select values for multiplexer output channels and then outputs the selected values to the formatting unit 160.

More specifically, the PIN data selector 140 includes normal multiplexers 141–143, each having an output channel MUX_CHANNEL_1-(n-2), respectively, and high-speed multiplexers 145, 146, each having an output channel MUX_CHANNEL_(n-1), n, respectively. Each of the normal multiplexers 141–143 is constructed having seventy-eight inputs and one output to select PIN data. Each of the high-speed multiplexers 145, 146 is also constructed having seventy-eight inputs and one output to select PIN data.

Figure 6:
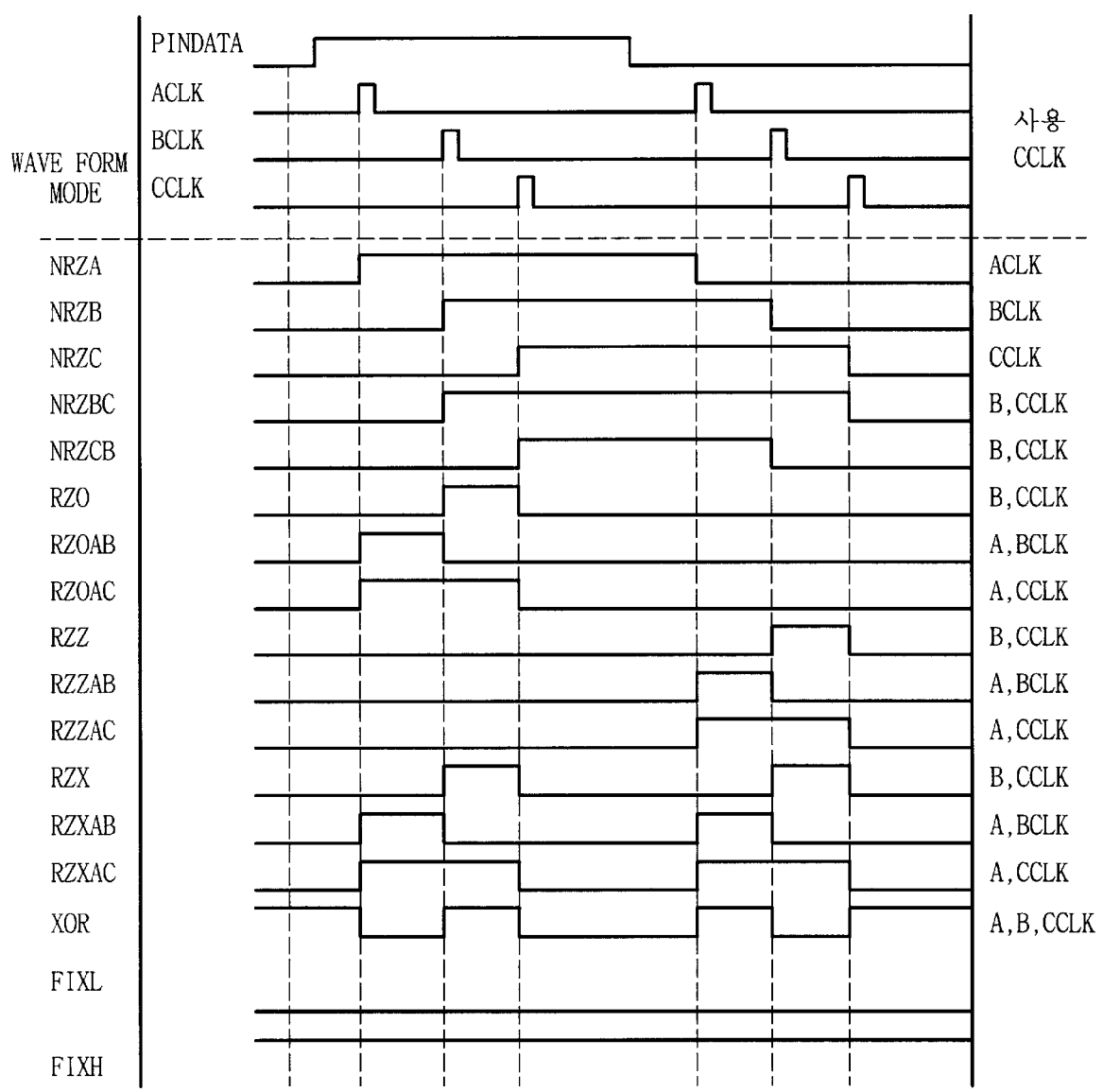
FIG. 6 is a timing diagram illustrating waveforms output from the formatters of the testing system shown in FIG. 5.

The waveform selector 150 selects a type of waveform to output from its multiplexer channels MUX_CHANNEL_1-n from among the various waveforms shown in FIG. 6, using the combination of input signals indicated. The selected waveform is then output to the formatting unit 160. The waveform selector 150 has normal multiplexers 151–153, each having an output channel MUX_CHANNEL_1-(n-2), respectively, and high-speed multiplexers 155, 156, each having an output channel MUX_CHANNEL_(n-1), n, respectively. The normal and high-speed multiplexers 151–153 and 155, 156 are each constructed with K inputs, where K represents the number of types of waveforms, and one output. Each of the multiplexers 151–153, 155, 156 selects an appropriate type of waveform from among its inputs to output from its output channels MUX_CHANNEL_1-n, respectively. The waveform inversion value WINV is also received by the waveform selector 150 and is used to determine whether the waveform will be output directly or whether it will be inverted before being output.

The formatting unit 160 communicates with the clock selector 130, the PIN data selector 140, and the waveform selector 150. The formatting unit 160 receives and formats the clock information selected by the clock selector 130, the PIN data selected by the PIN data selector 140, and the waveform information selected by the waveform selector 150. The formatting unit 160 then generates output waveforms to control the PIN drivers 301, 302, 304, 305, 306. The generated waveforms are directed to specific formatters 161–163, 165, 166 of the formatting unit 160 to operate the corresponding PIN drivers 304–306, 301, 302, respectively.

More specifically, the formatting unit 160 includes normal formatters 161–163 connected to the normal PIN drivers 304–306. The formatting unit 160 also includes high-speed formatters 165, 166 connected to the high-speed PIN drivers 301, 302. In this embodiment, one signal output from a formatter is converted into sixty-four outputs to drive the PIN drivers.

Each of the normal multiplexers 131–133 of the clock selector 130 is connected to one of the normal formatters 161–163, respectively. Each of the normal multiplexers 131–133 has three clock output lines. Each of the high-speed multiplexers 135, 136 is connected to one of the high-speed formatters 165, 166, respectively. Each of the high-speed multiplexers 135, 136 has eight clock output lines. Because the number of clock output lines of the high-speed multiplexers 135, 136 is greater than that of the normal multiplexers 131–133, a wider range of selections can be made when the PIN drivers 301, 302 are driven at a high speed.

Accordingly, although a greater number of clocks are required to format the high-speed formatters 165, 166 than to format the normal formatters 161–163, both high-speed and normal-speed tests can be performed using a single testing unit according to this invention. If, for example, the normal PIN drivers 304–306 are driven at a first frequency of 31.25 MHz, the high-speed PIN drivers 301, 302 can be driven at a second frequency of 125 MHz using the high-speed formatters 165, 166. The testing system of this invention therefore allows both high-speed and normal-speed testing to be done using a single testing unit.

FIG. 6 illustrates various waveforms output from the normal formatters 161–163 of the system frame 100 of FIG. 5. As shown, each normal formatter 161, 162, 163 can format a variety of waveforms to be output using the PIN data signal PINDATA and input clock signals ACLK, BCLK, CCLK.

Figure 7:
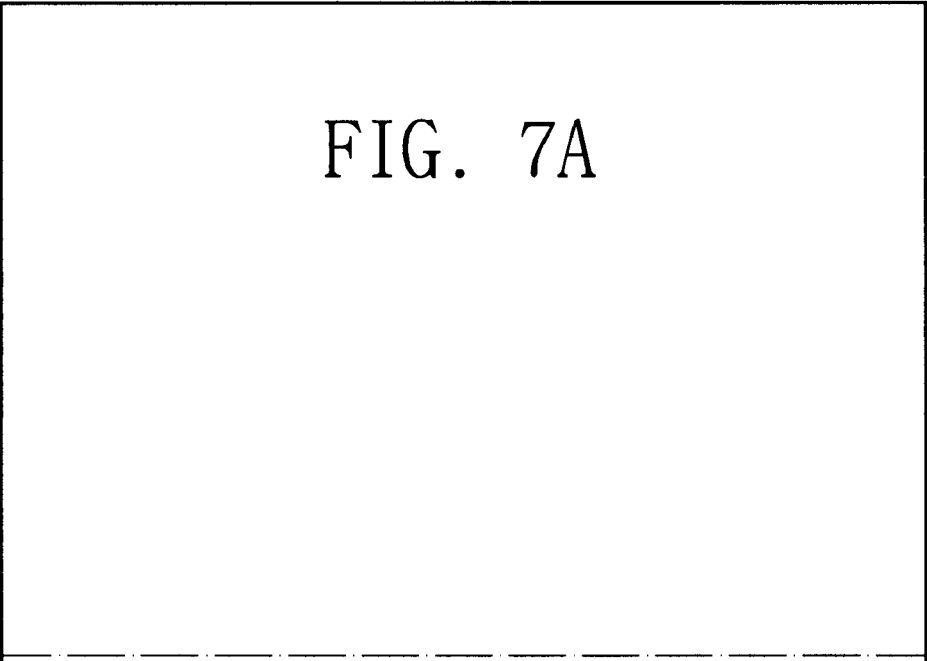
FIGS. 7A and 7B are schematic circuit diagrams illustrating the electronic arrangement of one of the normal formatters of the testing system of FIG. 5.
Figure 7:
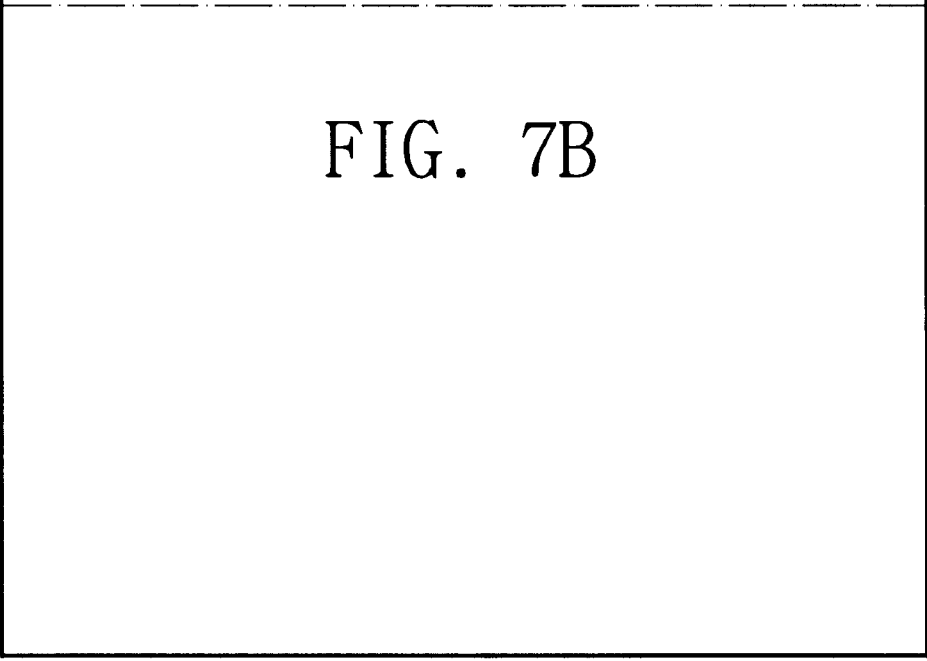
Figure 7A:
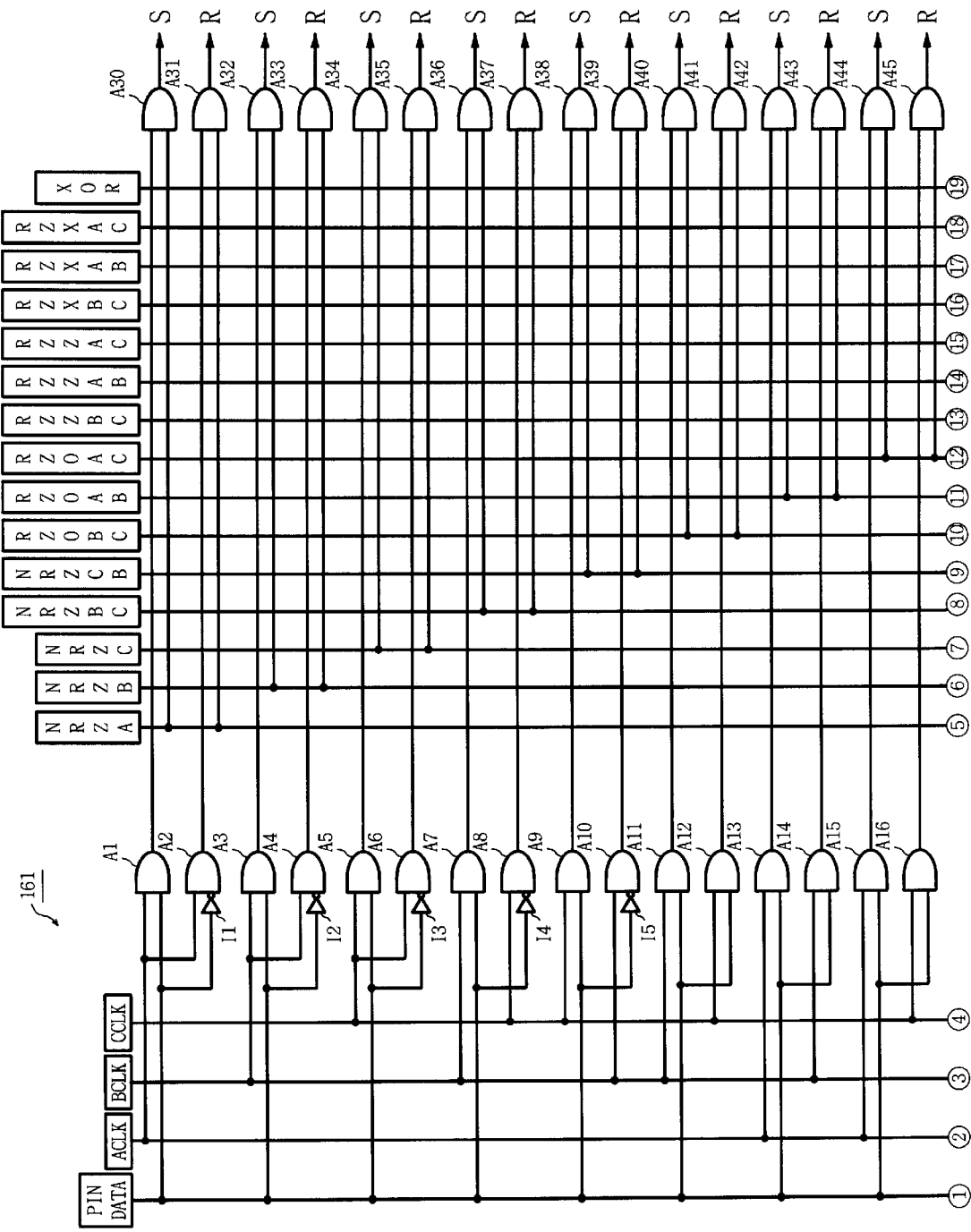
Figure 7B:
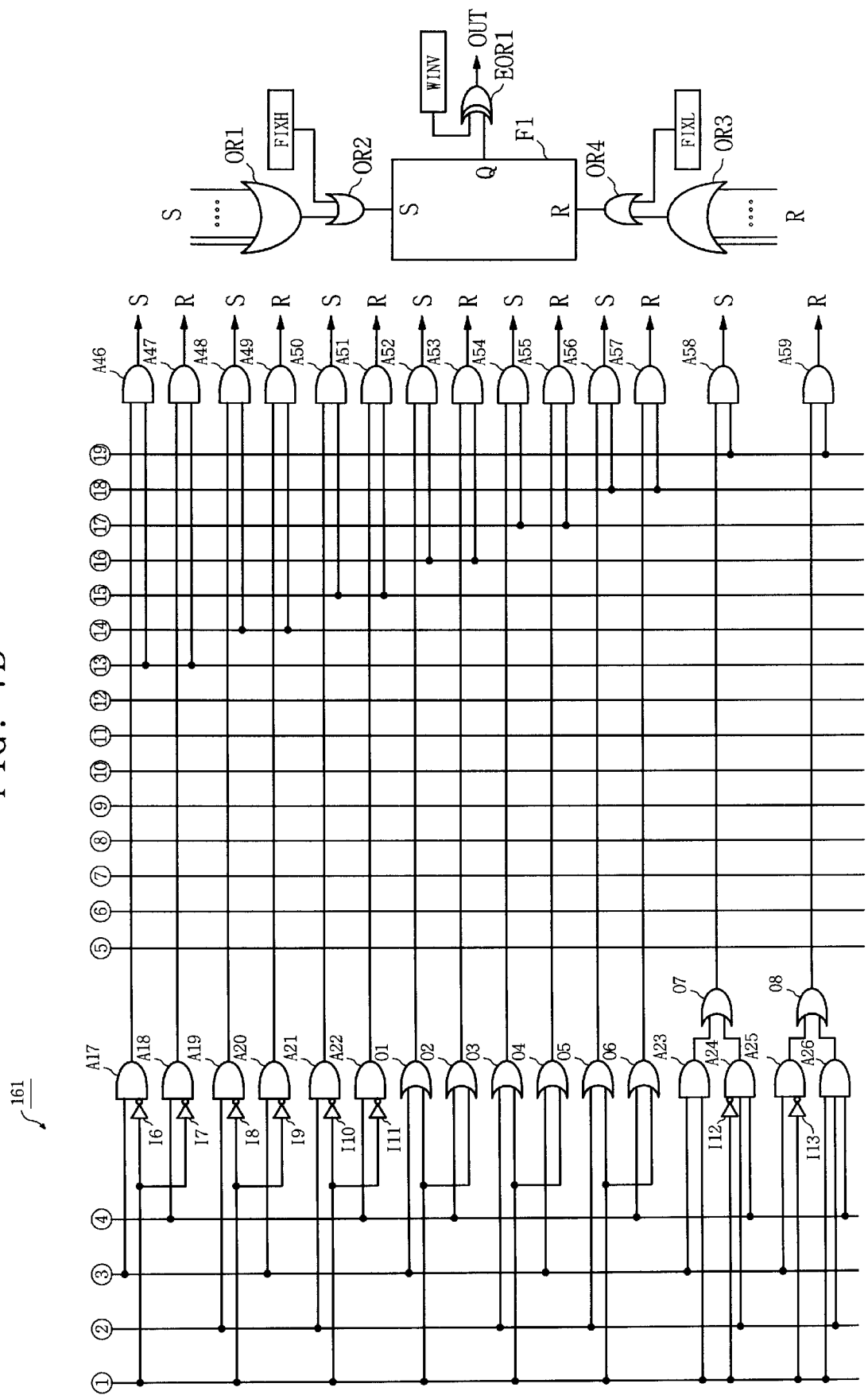

FIGS. 7A and 7B are schematic circuit diagrams illustrating the construction of a normal formatter 161 of the system frame 100 shown in FIG. 5. The circuits shown in FIGS. 7A and 7B interconnect with each other at the points indicated by circled numbers 1–19. Referring to FIGS. 7A and 7B, each formatter includes several inverters 11–13, AND gates A1–26, and OR gates OR1–8 for combining and processing the logic states provided by the PIN data signal PINDATA and the input clock signals ACLK, BCLK, CCLK. Additional AND gates A30–59 are also provided to generate signals R, S to control flip-flop F1 operations by AND-gating one of the outputs of the AND gates A1–26 or one of the outputs of the OR gates OR1–8 with a waveform from the waveform selector 150.

An OR gate ORS generates an OR-gated response by receiving the S signals (i.e., the output from every other one of the AND gates A30–59, beginning with AND gate A30) as inputs. An OR gate ORR generates a separate OR-gated response by receiving the R signals (i.e., the output from other one of the AND gates A30–59, beginning with AND gate A31) as inputs. An OR gate ORH generates an OR-gated response by OR-gating an output of the OR gate ORS and a high logic level FIXH. An OR gate ORL generates an OR-gated response by OR-gating an output of the OR gate ORR and a low logic level FIXL.

An RS flip-flop F1 receives the output of the OR gate ORR into its S input terminal and the output of the OR gate ORL into its R input terminal. A result of an RS flip-flop operation is provided through its output terminal Q. Finally, an exclusive OR gate XOR1 generates a formatting output OUT to be provided to the normal PIN drivers by exclusively ORing the output from the output terminal Q of the RS flip-flop F1 and the waveform inversion value WINV.

Figure 8:
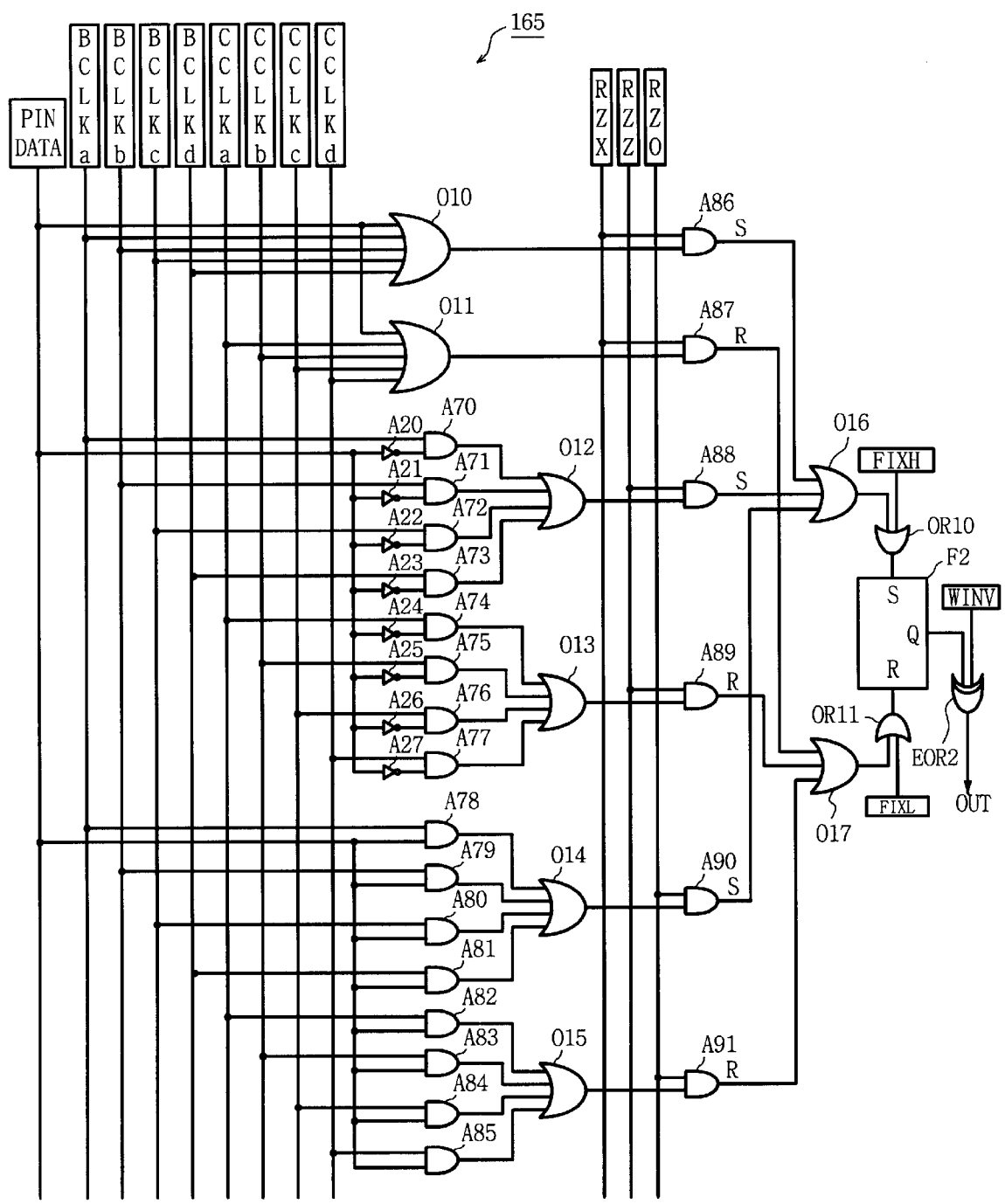
FIG. 8 is a schematic circuit diagram further illustrating the electronic arrangement of one of the high-speed formatters of the testing system shown in FIG. 5.

FIG. 8 is a schematic circuit diagram illustrating a high-speed formatters 165 of the system frame 100 shown in FIG. 5. Referring to FIG. 8, the high-speed formatter 165 includes multiple inverters 120–27, AND gates A70–85, and OR gates OR10–11, for combining logic levels from the PIN data signal PINDATA and input clock signals BCLKa–d, CCLKa–d. OR gates OR12–15 are included to generate an OR-gated response by each receiving and combining a corresponding group of four adjacent outputs from the AND gates A70–85. AND gates A86–91 generate signals R, S by AND-gating the outputs of the OR gates OR10–15 with the outputs of the waveform selector 150.

OR gate OR16 generates an OR-gated response by receiving and OR-gating the S signals (i.e., the signals output from every other one of the AND gates A86–91 beginning with AND gate A86). OR gate OR17 generates an OR-gated response by receiving and OR-gating the R signals (i.e., the signals output from every other one of the AND gates A86–91 beginning with AND gate A87). OR gate ORSHS generates an OR-gated response by receiving an output from the OR gate OR16 and a high logic level FIXH. OR gate ORRHS generates an OR-gated response by receiving an output of the OR gate OR17 and a low logic level FLXL. An RS flip-flop F2 receives the output of OR gate ORSHS into its S input terminal and the output of the OR gate ORRHS into its R input terminal. The RS flip-flop F2 then provides a result of an RS flip-flop operation through its output terminal Q. Finally, an exclusive OR gate XOR2 generates a formatting output OUT, to be provided to the high-speed PIN driver 301, 302, by exclusively ORing the output from the output terminal Q of the RS flip flop F2 and the waveform inversion value WINV.

As described above, the test head 200 of the semiconductor device testing system is constructed having high-speed PIN drivers 301, 302 as main PIN drivers, in addition to the normal PIN drivers 304–306. The semiconductor device testing system thus constructed has the capability of performing not only a first test at a normal speed, but also of performing a second test at a high speed. It accomplishes this by providing pre-formatted signals for the high-speed PIN drivers necessary to operate at a higher speed. As a result, the semiconductor device testing system of the present invention solves the problems of the prior art, in which a separate high-speed testing unit is required to perform high-speed tests. The invention thereby reduces the overall production cost of the system as well as the time required to perform the tests on the semiconductor device. In other words, the semiconductor device testing system of the present invention maximizes the testing capability of the semiconductor device testing system while reducing the overall production cost of the system.

While the invention has been described in terms of a preferred embodiment, those skilled in the art will recognize that the invention can be modified in any number of ways and still remain within the spirit and scope of the following claims. Among other things, for instance, the number of high-speed PIN drivers can be changed, and modifications can be made in the internal structure of the formatters and other system components.

What is claimed is:

1. A semiconductor device testing system comprising:
   a system frame comprising a formatting unit having a normal testing formatter and a high-speed testing formatter; and
   a test head arranged in electrical communication with the formatting unit, said test head comprising a normal PIN driver adapted to operate at a first speed to transmit a normal-speed test signal to a semiconductor device, and said test head further comprising a high-speed PIN driver adapted to operate at a second speed, higher than the first speed, to transmit a high-speed test signal to the semiconductor device.

2. A testing system according to claim 1, wherein the system frame further comprises:
   a timing generating unit comprising a clock generator;
   an algorithmic pattern generating unit comprising a pattern generator;
   a clock selector adapted to select a clock signal from the clock generator and to output the selected clock signal to the formatting unit;
   a PIN data selector adapted to select a PIN data value from a plurality of values supplied from the pattern generator, said PIN data selector further adapted to output the PIN data value to the formatting unit; and
   a waveform selector adapted to select a waveform from a plurality of waveforms and to output the selected waveform to the formatting unit.

3. A testing system according to claim 2, wherein the clock generator of the timing generating unit comprises at least thirty-two output lines and generates a plurality of clock signals and a rate signal.

4. A testing system according to claim 3, wherein the pattern generator of the algorithmic pattern generating unit generates an address, a control command, a data signal, a mode value, and a fixing level value, and is further configured to communicate electrically with the timing generating unit to define a signal within one operational cycle.

5. A testing system according to claim 2, wherein the clock selector comprises a plurality of normal multiplexers and a plurality of high-speed multiplexers configured to select clocks from a plurality of clock signals and a rate signal generated by the clock generator of the timing generating unit and further configured to output the selected signals to the formatting unit.

6. A testing system according to claim 2, wherein the PIN data selector comprises a plurality of normal multiplexers and a plurality of high-speed multiplexers configured to select values from a plurality of addresses, control commands, data signals, mode values, and fixed level values to output to the formatting unit.

7. A testing system according to claim 2, wherein the waveform selector comprises a plurality of normal multiplexers and a plurality of high-speed multiplexers adapted to select the waveform from the plurality of waveforms and to output the selected waveform to the formatting unit.

8. A testing system according to claim 2, wherein the formatting unit receives and formats the clock signal selected by the clock selector, the PIN data selected by the PIN data selector, and the waveform selected by the waveform selector; and wherein the formatting unit further generates a waveform to be output to the PIN drivers.

9. A testing system according to claim 8, wherein the formatting unit further comprises a plurality of normal formatters and a plurality of high-speed formatters, and wherein a signal output from each of the formatters is divided into a plurality of outputs.

10. A testing system according to claim 2, wherein the normal testing formatter comprises:
    a logic combination circuit comprising a plurality of gating elements adapted to perform a logic combination by receiving the PIN data and one or more clock signals as gate inputs;
    an RS flip-flop adapted to latch an output of the logic combination circuit; and
    an exclusive OR gate adapted: to generate a formatting output by exclusively ORing an output of the RS flip-flop and a waveform inversion value, and further adapted to provide the formatting output to the normal PIN driver.

11. A testing system according to claim 2, wherein the high-speed testing formatter comprises:
    a logic combination circuit comprising a plurality of gating elements adapted to perform a logic combination by receiving the PIN data and one or more clock signals;
    an RS flip-flop adapted to latch an output of the logic combination circuit; and
    an exclusive OR gate adapted to generate a formatting output by exclusively ORing an output of the RS flip-flop and a waveform inversion value, said exclusive OR gate further adapted to supply the formatting output to the high-speed PIN driver.

12. A semiconductor device testing system comprising:
    a test head;
    a normal PIN driver located in the test head, said normal PIN driver adapted to operate as a main PIN driver to provide signals necessary to perform normal-speed testing operations on a semiconductor memory device; and
    a high-speed PIN driver located in the test head, said high-speed PIN driver adapted to provide signals necessary to perform high-speed testing operations on the semiconductor memory device.

13. The semiconductor device testing system according to claim 12, further comprising a formatting unit comprising a normal-speed formatter and a high-speed formatter.

14. The semiconductor device testing system according to claim 13, wherein the normal-speed formatter comprises logic circuitry configured to supply a normal-speed test signal to the normal PIN driver.

15. The semiconductor device testing system according to claim 13, wherein the high-speed formatter comprises logic circuitry configured to supply a high-speed test signal to the high-speed PIN driver.

16. The semiconductor device testing system according to claim 12, further comprising:
    a clock generator configured to generate a plurality of clock signals;
    a clock selector adapted to select one of the clock signals from the clock generator;
    a pattern generator configured to generate a plurality of testing values;
    a PIN data selector adapted to select one of the testing values from the pattern generator as a PIN data value; and
    a waveform selector adapted to select a waveform to output to one or more of the formatters.

17. A method of manufacturing a semiconductor device testing system capable of performing both normal and high-speed tests on a semiconductor device, the method comprising:
    configuring a test head of a semiconductor memory device testing system with a normal-speed PIN driver adapted to perform a first test at a normal speed;
    configuring the test head of the semiconductor memory device testing system with a high-speed PIN driver adapted to perform a second test at a high-speed; and
    adapting a formatter to supply a plurality of pre-formatted signals to the high-speed PIN driver to perform the second test.

18. A method of manufacturing a semiconductor device testing system according to claim 17, further comprising:
    adapting a clock generator to supply a plurality of clock signals using a single input clock.

19. A method of manufacturing a semiconductor device testing system according to claim 18, further comprising:
    adapting a clock selector to select one of the plurality of clock signals from the clock generator.

20. A method of manufacturing a semiconductor device testing system according to claim 17, further comprising:
    adapting a waveform selector to select a waveform from a plurality of waveforms to output to the formatter.

* * * * *

UNITED STATES PATENT AND TRADEMARK OFFICE
CERTIFICATE OF CORRECTION

PATENT NO. : 6,507,801 B1
DATED : January 14, 2003
INVENTOR(S) : Oh et al.

It is certified that error appears in the above-identified patent and that said Letters Patent is hereby corrected as shown below:

<u>Title page,</u>
Item [57], ABSTRACT,
Line 12, "able-to" should read -- able to --.

<u>Column 3,</u>
Line 60, "PfN" should read -- PIN --.

<u>Column 4,</u>
Line 46, "T1; to the" should read -- T1 to the --.
Line 54, "system, 10" should read -- system 10 --.

<u>Column 5,</u>
Line 4, "generator 11" should read -- generator 111 --.
Line 16, "ACLK~18" should read -- ACLK~8 --.

<u>Column 6,</u>
Line 61, "11-13" should read -- I1-13 --.

<u>Column 7,</u>
Line 16, "OR gate ORR" should read -- OR gate ORH --.
Line 26, "inverters 120-127" should read -- inverters I20-27 --.
Line 45, "FLXL" should read -- FIXL --.

<u>Column 9,</u>
Line 24, "adapted:to" should read -- adapted to --.

Signed and Sealed this

Second Day of December, 2003

JAMES E. ROGAN
*Director of the United States Patent and Trademark Office*